United States Patent
Vitek et al.

(10) Patent No.: US 7,047,515 B1
(45) Date of Patent: May 16, 2006

(54) METHOD FOR SELECTING AND PLACING BYPASS CAPACITORS ON MULTI-LAYER PRINTED CIRCUIT BOARDS

(75) Inventors: Clark A. Vitek, Portland, OR (US); Nitin Bhandari, Mountain View, CA (US)

(73) Assignee: Extreme Networks, Santa Clara, CA (US)

( * ) Notice: Subject to any disclaimer, the term of this patent is extended or adjusted under 35 U.S.C. 154(b) by 250 days.

(21) Appl. No.: 10/407,398

(22) Filed: Apr. 4, 2003

(51) Int. Cl.
*G06F 17/50* (2006.01)

(52) U.S. Cl. .............................. 716/15; 716/10; 716/13; 716/14

(58) Field of Classification Search .............. 716/8–15; 333/12; 365/51, 52; 361/117, 782; 257/777
See application file for complete search history.

(56) References Cited

U.S. PATENT DOCUMENTS

| | | | |
|---|---|---|---|
| 5,162,977 | A | 11/1992 | Paurus et al. |
| 6,320,758 | B1 * | 11/2001 | Chen et al. .................. 361/782 |
| 6,523,158 | B1 * | 2/2003 | Hidaka ......................... 716/10 |
| 6,535,411 | B1 * | 3/2003 | Jolin et al. .................... 365/52 |
| 6,629,298 | B1 * | 9/2003 | Camporese et al. ........... 716/6 |
| 6,691,296 | B1 * | 2/2004 | Nakayama et al. ........... 716/15 |
| 6,738,249 | B1 * | 5/2004 | Anthony et al. ............ 361/117 |
| 6,768,208 | B1 * | 7/2004 | Lin et al. ..................... 257/777 |
| 6,870,436 | B1 * | 3/2005 | Grebenkemper ............. 333/12 |

OTHER PUBLICATIONS

NetLogic Microsystems, Note entitled "Decoupling Capacitor Selection," Date Unknown.

Archambeault, Bruce, "Power Ground-Reference Plane Decoupling Analysis of Design Alternatives," IEEE EMC International Symposium Record (Aug. 13-17, 2001), vol. 2, pp. 1217-1220, Montreal, Canada.

Hubing, Todd H., "Power Bus Decoupling on Multilayer Printed Circuit Boards," IEEE Transactions on Electromagnetic Compatibility (May 1995), vol. 37, No. 2, pp. 155-166.

Hubing, Todd H., "Strategies for Effective Printed Circuit Board Power Bus Decoupling," Phoenix EMC Society Chapter Meeting (Feb. 2002), pp. 1-64.

(Continued)

*Primary Examiner*—Vuthe Siek
(74) *Attorney, Agent, or Firm*—Fenwick & West LLP

(57) ABSTRACT

A method places bypass capacitors for controlling the signal integrity of a signal routed between devices on a multi-layer printed circuit board by analysis of the routing of the signal and the signal characteristics. In general, when an interconnecting signal between devices is routed adjacent to an impedance control plane that does not serve as the circuit supply voltage plane or the reference voltage plane for all devices interconnected by the signal trace, the method selects locations for addition of bypass capacitors based upon the routing of the interconnecting signal trace to improve signal integrity.

21 Claims, 7 Drawing Sheets

OTHER PUBLICATIONS

Smith, Larry, "Simultaneous Switching Noise and Power Plane Bounce for CMOS Technology," Date Unknown.

Smith, Larry, et al., "Power Distribution System Design Methodology and Capacitor Selection for Modern CMOS Technology," Date Unknown.

Smith, Larry, et al., "Power Plane Spice Models for Frequency and Time Domains," Date Unknown.

Xu, Minjia et al., "Power-Bus Decoupling With Embedded Capacitance in Printed Circuit Board Design," IEEE Transactions on Electromagnetic Compatibility (Feb. 2003), vol. 45, No. 1, pp. 22-30.

* cited by examiner

METHOD FOR SELECTING AND PLACING BYPASS CAPACITORS ON MULTI-LAYER PRINTED CIRCUIT BOARDS

TECHNICAL FIELD

The present invention relates generally to controlling electronic noise in multi-layer printed circuit boards, and more specifically, to a method for selecting and placing bypass capacitors on multi-layer printed circuit boards in order to control noise and improve signal integrity.

BACKGROUND OF THE INVENTION

Multi-layer printed circuit boards are widely used in modern electronics technology to interconnect various components in a compact and efficient manner. These components include active Integrated Circuits (ICs) or passive discrete components (resistors, capacitors, and the like). As electronic circuits become more complex and use a larger number of components, printed circuit boards must typically accommodate more electronic components in the same surface area. As a result, electronic components have become densely located and modern printed circuit boards use multiple layers to provide various supply and return voltages such as 5 V, 3.3 V, and Ground (GND). In addition, these supply and return voltage planes are used as impedance control planes (also referred to as "reference planes") for controlling the characteristic impedance of interconnecting signal routing. Modern printed circuit boards typically use multiple signal routing layers ("signal layers") adjacent to the reference planes for routing signals between components. As larger number of electronic components are used and densely located on printed circuit boards, these electronic components generate an increasing level of noise associated with power distribution among the electronic components. Various techniques (generally termed "decoupling") have been developed so far to somewhat control the noise generated on multi-layer printed circuit boards.

Capacitors have been widely used in electronic circuits to control noise in power distribution. For example, decoupling capacitors have been widely used in printed circuit boards for controlling noise from active devices on printed circuit boards. Conventional decoupling capacitors are selected and placed based upon techniques such as local decoupling, bulk decoupling, and embedded (or "buried") capacitance.

Local decoupling requires that capacitors be placed between the supply voltage (Vcc) and the return voltage (typically GND) connections of an active electronic component. As such, local decoupling capacitors provide a local source of instantaneous current for active devices (also referred to as "parts"). By supplying charge for instantaneous current demand close to the active devices, it is possible to limit the amount of transient voltage disturbance generated in the power distribution close to these actives devices. Local decoupling capacitors are selected based upon analysis of the instantaneous current requirement and the acceptable transient noise between the power supply and return voltage connections of each part and are placed as close as possible to that part's power supply connection pins on each part (hence, "local decoupling capacitors"). Local decoupling capacitors typically range in value from 0.001 µF to 22 µF and are placed as close as possible to the power and ground pins of the individual parts.

Bulk decoupling serves the same purpose as local decoupling, but uses larger value capacitors that are typically placed further away from the parts. In other words, bulk decoupling uses larger capacitance values associated with a group of parts rather than individual parts and the bulk decoupling capacitors are placed further away from each individual part. Bulk decoupling also limits the transient noise generated on the Vcc/GND power distribution. Bulk capacitors are typically in the range of 47 µF to several 10,000 µF.

Embedded capacitance employs closely spaced power/ground plane pairs to build a low inductance capacitor for decoupling power/ground transients from active devices. Embedded capacitance is generally more effective at higher frequencies than standard capacitor construction, and due to the relatively low capacitance value (typically less than 0.01 µF) its purpose is typically to provide more effective high frequency local decoupling for active devices. U.S. Pat. No. 5,162,977 to Paurus et al., entitled "Printed Circuit Board Having an Integrated Decoupling Capacitive Element" describes the technique of building buried capacitance in detail. Embedded capacitance is more effective at higher frequencies than local decoupling or bulk decoupling, but its purpose is limited to controlling high frequency transient noise on the power/ground distribution generated by active devices.

As explained above, all conventional decoupling capacitors such as local decoupling, bulk decoupling, and buried capacitance, are effective only for controlling transient noise on the power/ground distribution generated by active devices. In other words, conventional decoupling capacitors are selected and placed based solely upon consideration of the power/ground noise characteristics and/or the power/ground pin locations of the active devices. The conventional decoupling capacitors are not selected based upon analysis of the interconnecting signal information or the interconnecting signal route information. Therefore, the conventional decoupling capacitor placement does not control the noise generated by the specific signal path (also referred to as "signal traces") of interconnecting routes between active devices.

In conventional systems, interconnecting signal traces are routed as traces over a plane (called "microstrip" or "stripline" transmission lines). In the typical situation on a multi-layer PCB, an interconnecting signal trace is routed on a signal layer and the immediately adjacent voltage or ground plane is used as the impedance control/signal return plane. A circuit model analysis of current flow in the transmission line structure shows that, at high frequencies, the majority of signal return current flows as the mirror image in the impedance control plane, where the total impedance of the return path in the plane is lowest. Using a field model for the microstrip or stripline transmission line structure, it is understood that the electromagnetic field density is greatest in the region of dielectric captured between the signal trace and the plane, and much lower outside of this region. Thus, the energy transfer (current flow in the circuit model) between devices occurs in the region of the PCB between the signal trace and its impedance control plane.

On modern printed circuit boards with multiple supply voltages and ground planes, the path of the return current becomes problematic when the signal trace transitions routing layers and uses different planes for impedance control. This is a particular problem if the impedance control planes used are not the same (i.e. coupled to a different potential), because in such situation the path to the nearest decoupling capacitors will determine the locations for allowing the return current to transition between reference planes. For optimum noise control and signal integrity, the signal return current should have a location for transitioning that is close to the signal trace layer transition (called the signal "via"). FIGS. 1–3 described below show how the signal return current on the conventional signal path can create serious problems for signal integrity on multi-layer printed circuit boards.

FIG. 1 is a diagram illustrating a first conventional multi-layer printed circuit board 100 including four layers, a Vcc1 supply voltage plane 102, a Vcc2 supply voltage plane 104, a ground (GND) plane 106 with conventional local decoupling capacitors 128, 130, 132, and signal routing layer in which the signal current 134 is routed. Two active devices, device 108 (driver part), device 110 (receiver part), and another active device 112 (unrelated to devices 108 and 110) are placed on the printed circuit board 100. The devices 108, 110, 112 may be any type of device such as an active integrated circuit (IC) chip or a discrete component. Device 108 has at least three pins 114, 116, 118, device 110 has at least three pins 120, 122, 124, and device 112 has at least two pins 125, 126. Devices 108 and 110 are powered by the Vcc1 plane 102, while device 112 is powered by the Vcc2 plane 104. Device 108 is connected to the Vcc1 plane 102 via pin 114, to the GND plane 106 via pin 116, and to device 110 via pin 118. Device 110 is connected to the Vcc1 plane 102 via pin 120, to the GND plane 106 via pin 122, and to device 108 via pin 124. Device 112 is connected to the Vcc2 plane 104 via pin 126 and to the GND plane 106 via pin 125.

Capacitors 128, 130, 132 are conventional local decoupling capacitors connected between the voltage source planes and ground planes to which devices 108, 110, 112 are connected. Specifically, capacitor 128 is a local decoupling capacitor connected between pin 114 and pin 116. Capacitor 130 is a local decoupling capacitor connected between pin 120 and pin 122. Capacitor 132 is a local decoupling capacitor connected between pin 125 and pin 126.

A signal current (solid line) 134 flows on the signal path in a routing layer between pin 118 of device 108 to pin 124 of device 110 with the current propagating in the routing layer routed adjacent to part of the GND plane 106. Here, the GND plane 106 is called the "reference plane" or "impedance control plane" for the routing layer in which the signal current 134 flows. As can be seen in FIG. 1, the current signal between pins 118 and 124 is routed adjacent a reference plane 106 to which both the devices 108 and 110 are coupled. As such, the return current (dotted line) 136 required according to Kirchoff's first law can flow back from device 110 to device 108 via pins 122, 114, on part of the GND plane 106 (reference plane), with the connection to the local decoupling capacitor 128 providing the return current path between pin 122 of device 110 and pin 114 of device 108. Therefore, as shown in FIG. 1, the local decoupling capacitor 128 alone is capable of providing the return current path for the signal path between pin 118 and pin 124, when the signal current 134 is routed against a reference plane to which the driver device and the receiver device are coupled. There is no need for additional bypass capacitors, because the loop area of the signal path is already minimized by the connecting the conventional decoupling capacitors 128, 130. It is obvious from FIG. 1 that device 112 or its local decoupling capacitor 132 plays no role in providing a return current path between devices 108, 110 for controlling noise in the signal path therebetween.

FIG. 2 is a diagram illustrating a second conventional multi-layer printed circuit board 200 including four layers, a Vcc1 supply voltage plane 202, a Vcc2 supply voltage plane 204, a GND plane 206 with conventional local decoupling capacitors 230, 232, 234, and a routing layer in which a signal current 236 is routed. Two active devices, device 208 (driver part), device 210 (receiver part), and another active device 212 (unrelated to devices 208 and 210) are placed on the printed circuit board 200. The devices 208, 210, 212 may be any type of device such as an active integrated circuit (IC) chip or a discrete component. Device 208 has at least three pins 214, 216, 218, device 210 has at least three pins 220, 222, 224, and device 212 has at least two pins 226, 228. Devices 208 and 210 are powered by the Vcc1 plane 202, while device 212 is powered by the Vcc2 plane 204. Device 208 is connected to the Vcc1 plane 202 via pin 214, to the GND plane 206 via pin 216, and to device 210 via pin 218. Device 210 is connected to the Vcc1 plane 202 via pin 222, to the GND plane 206 via pin 224, and to device 208 via pin 220. Device 212 is connected to the Vcc2 plane 204 via pin 226 and to the GND plane 206 via pin 228.

Capacitors 230, 232, 234 are conventional local decoupling capacitors connected between the voltage source planes and ground planes to which devices 208, 210, 212 are connected. Specifically, capacitor 230 is a local decoupling capacitor connected between pin 214 and pin 216. Capacitor 232 is a local decoupling capacitor connected between pin 222 and pin 224. Capacitor 234 is a local decoupling capacitor connected between pin 226 and pin 228.

In the printed circuit board 200 of FIG. 2, a signal trace (solid line) 236 represents current that flows on the signal path in the routing layer between pin 218 of device 208 to pin 220 of device 2 with the current routed in the routing layer adjacent to part of the Vcc2 plane 204 for impedance control. Vcc2 plane 204 is not GND and does not power the devices 208, 210. This type of signal routing is a common practice that permits for improved routing efficiency in multi-layer printed circuit boards. Here, the Vcc2 plane 204 operates as an alternate reference plane (or impedance control plane) for the signal current (solid line) 236.

As can be seen in FIG. 2, the current signal 236 between pins 218 and 220 is routed in a routing layer routed adjacent to a reference plane 204 that does not power the devices 208 and 210. The devices 208 and 210 are not coupled to the Vcc2 reference plane 204. As such, the return current (dotted line) required according to Kirchoff's law cannot flow back directly from device 210 to device 208 via pins 224, 214, because the return current does not have a local path near the devices 208 and 210 for transitioning between reference planes. Rather, the return current has to find a separate local decoupling capacitor 234 far away from the devices 208, 210 and coupled between the Vcc2 reference voltage plane 204 and the GND plane 206 for transitioning between reference planes. This local decoupling capacitor 234 for device 212 is unrelated to the signal current 236 and is located far away from devices 208, 210, but nevertheless has to provide the return current path between pins 224 and 214. Thus, the return current has to flow along a long path 238, 240, 242, 244, 246, 248, 250, 252, and 254, resulting in a large and uncontrolled return current path that leads to (i) a large loop area created by the signal current and its return current, and (ii) a large difference in path length between the signal current and its return current path. Large loop area and large difference in path length can result in increased crosstalk between active circuits due to increased inductive coupling (increased "loop area"), and in increased signal transmission line reflection due to impedance discontinuities at the signal transition locations. The increased length of the return path relative to the signal path also results in unbalance. All of these factors deteriorate signal integrity. Signal transmission line reflection due to impedance discontinuities, inductive crosstalk to other signals due to a larger loop area formed by the signal trace and its return current, and imbalance due to a difference in path length of the signal trace and its return current are all generally referred to as "reduced signal integrity" herein. Therefore, the conventional local decoupling capacitors 230, 232 alone are not capable of controlling the noise on the signal path between pin 218 and pin 224, because the signal cur rent is routed adjacent to an impedance control plane not powering or serving as the circuit reference (GND) between the driver and receiver devices 208, 210.

FIG. 3 is a diagram illustrating a third conventional multi-layer printed circuit board 300 including six layers, a Vcc1 supply voltage plane 302, a first GND plane 304, a Vcc2 supply voltage plane 306, and a second GND plane 308, with conventional local decoupling capacitors 326, 328, and two routing layers in which the signal currents 330 and 361 flow. Two active devices, device 310 (driver part) and device 312 (receiver part), are placed on the printed circuit board 300. The devices 310, 312 may be any type of device such as an active integrated circuit (IC) chip or a discrete component. Device 310 has at least three pins 314, 316, 318, and device 312 has at least three pins 320, 322, 324. Both devices 310 and 312 are powered by the Vcc1 plane 302. Device 310 is connected to the Vcc1 plane 302 via pin 314, to the GND plane 304 via pin 316, and to device 312 via pin 318. Device 312 is connected to the Vcc1 plane 302 via pin 322, to the GND plane 304 via pin 324, and to device 310 via pin 320.

Capacitors 326, 328 are conventional local decoupling capacitors connected between the voltage source planes and ground planes to which devices 310, 312 are connected. Specifically, capacitor 326 is a local decoupling capacitor connected between pin 314 and pin 316. Capacitor 328 is a local decoupling capacitor connected between pin 322 and pin 324. These capacitors are connected to planes 302 and 304.

In the printed circuit board 300 of FIG. 3, a signal current (solid line) 330 flows on the signal path between pin 318 of device 310 to pin 320 of device 312 with the interconnecting signal flowing in a routing layer routed adjacent to parts of both the Vcc2 plane 306 and the second GND plane 308 for impedance control. The Vcc2 plane 306 does not power the devices 310, 312. Thus, the signal current 330 is routed in the routing layer adjacent to reference planes (impedance control planes) not powering the devices 310, 312, and is also routed in routing layers adjacent to two reference planes (impedance control planes) 306, 308. The signal current 330 transitions between reference planes or impedance control planes by way of "routing vias" 360, 362. This use of routing vias affords improved routing efficiency in multi-layer printed circuit boards as the signal trace can be routed on multiple signal layers.

As can be seen in FIG. 3, the current signal between pins 318 and 320 is routed in a routing layer adjacent to two reference planes 306, 308. The devices 310 and 312 are not coupled to the Vcc2 reference plane 306. Thus, there are no capacitors connected to the Vcc2 plane 306. As such, the return current (dotted line) required according to Kirchoff's first law cannot flow back directly from device 312 to device 310 via pins 324, 314, because the return current does not have a local path near the devices 310 and 312 for transitioning between reference planes. Specifically, the return current may have paths from pin 324 to point 336 along path 334, from point 338 to point 342 along path 340, from point 344 to point 348 along path 346, from point 350 to point 354 along path 352, and from point 356 to pin 316 along path 358. However, there is no return current path between point 336 and point 338, between point 342 and point 344, between 348 and point 350, and between point 354 and point 356. Rather, as in the printed circuit board of FIG. 2, the return current has to find an arbitrary (uncontrolled) decoupling capacitor(s) (not shown) potentially far away from the devices 310, 312 and coupled between the Vcc2 plane 306 and the GND planes 304, 308 in order to transition between these reference planes. These local decoupling capacitor(s) (not shown) are unrelated to the signal current 330 and may be located far away from devices 310, 312, but nevertheless have to provide the missing return current paths between pins 324 and 314. Thus, the return current (dotted line) follows a long and uncontrolled return current path that leads to (i) a large loop area created by the signal current and its return current, and (ii) a large difference in path length between the signal current and its return current path. This long return path can deteriorate signal integrity. The conventional local decoupling capacitors 326, 328 alone are not capable of controlling noise and signal integrity on the signal path between pin 318 and pin 320, because there are routing vias 360, 362 in the signal current path between the driver and receiver devices.

Therefore, there is a need for a method for controlling noise and improving signal integrity in multi-layer printed circuit boards based upon analysis of the interconnecting signal information or the interconnecting signal routing information. Furthermore, there is also a need for a method for selecting and placing bypass capacitors for controlling noise and improving signal integrity in multi-layer printed circuit boards based upon analysis of the interconnecting signal information or the interconnecting signal route information.

SUMMARY OF INVENTION

The present invention provides a method of determining locations for placing bypass capacitors for controlling the signal integrity of signals routed from a first device to a second device via an interconnecting signal trace on a multi-layer printed circuit board by analysis of the routing of the signal and its signal characteristics. In one embodiment, the printed circuit board includes at least a first layer, a second layer, a third layer, and a fourth layer. The first layer powers the first device and the second device. The second layer serves as a reference voltage plane for the first and second devices. The third layer serves as a routing layer for the interconnecting signal trace, and the fourth layer serves as an impedance control plane for the interconnecting signal trace but does not power nor serve as the voltage reference plane for the first and second devices. The method analyzes the routing of the interconnecting signal trace, and determines a location for a bypass capacitor based upon routing of the interconnecting signal trace in the third layer adjacent to the fourth layer.

In one embodiment, the method determines a location near a source point of the signal at the first device between the second layer and the fourth layer as the location for the bypass capacitor. In another embodiment, the method determines a location near a termination point of the signal at the second device between the second layer and the fourth layer as the location for the bypass capacitor.

In still another embodiment, the printed circuit board further includes a fifth layer and a sixth layer, where the fifth layer also serves as a routing layer for the interconnecting signal trace, and the sixth layer also serves as an impedance control plane for the interconnecting signal trace. The method determines a location for a bypass capacitor near a routing via of the signal between the fourth layer and the sixth layer.

In general, when an interconnecting signal between devices on a printed circuit board is routed adjacent to an impedance control plane that does not serve as the circuit supply voltage plane or the reference voltage plane for all devices that are interconnected by the signal trace, the method of the present invention selects locations for decoupling capacitors based upon the interconnecting signal trace to provide a controlled path for the signal's return current.

By use of the bypass capacitors on multi-layer printed circuit boards, the total area of the current loop formed by the signal trace and its return current can be minimized. Signal integrity, which is influenced by factors such as impedance, inductive crosstalk to other signals, signal transmission line reflection, and balance, can be improved and noise can be well controlled.

BRIEF DESCRIPTION OF THE DRAWINGS

The teachings of the present invention can be readily understood by considering the following detailed description in conjunction with the accompanying drawings.

DETAILED DESCRIPTION OF EMBODIMENTS

Figure 1:
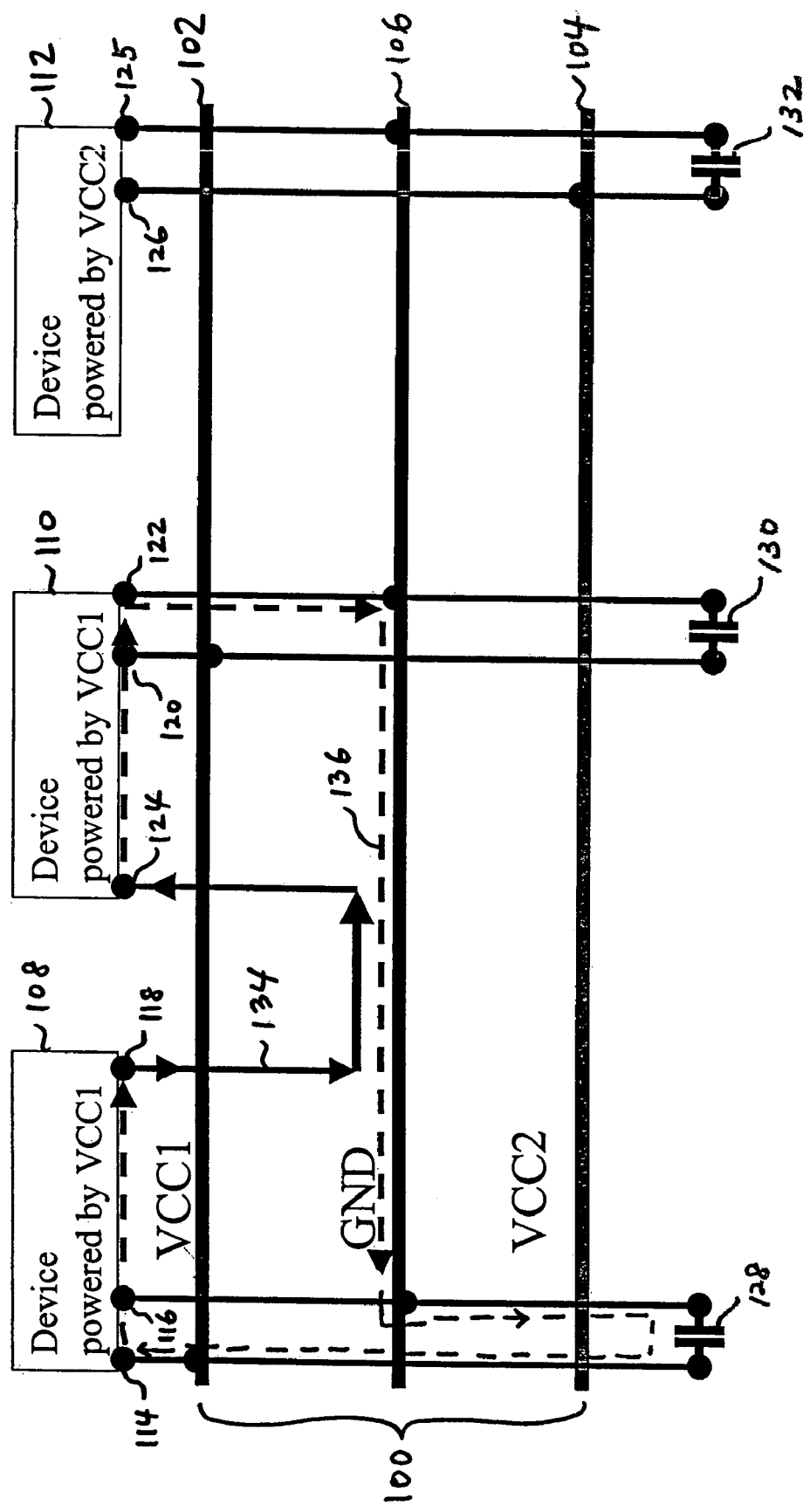
FIG. 1 is a diagram illustrating a first conventional multi-layer printed circuit board with conventional local decoupling capacitors.

Several embodiments of the present invention will be described below with reference to the accompanying drawings. Like reference numerals are used for like elements in the accompanying drawings.

Figure 2:
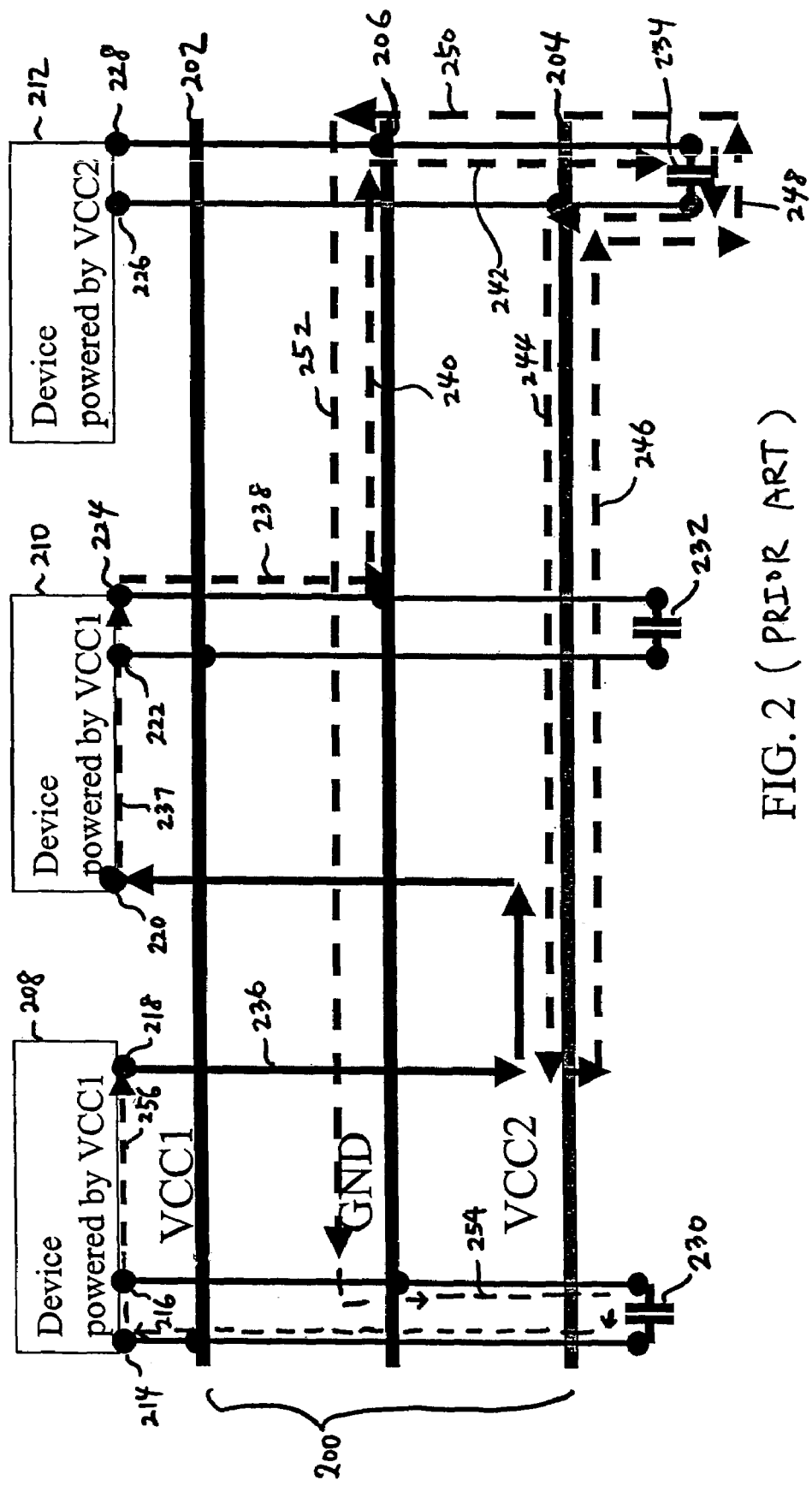
FIG. 2 is a diagram illustrating a second conventional multi-layer printed circuit board with conventional local decoupling capacitors.
Figure 4:
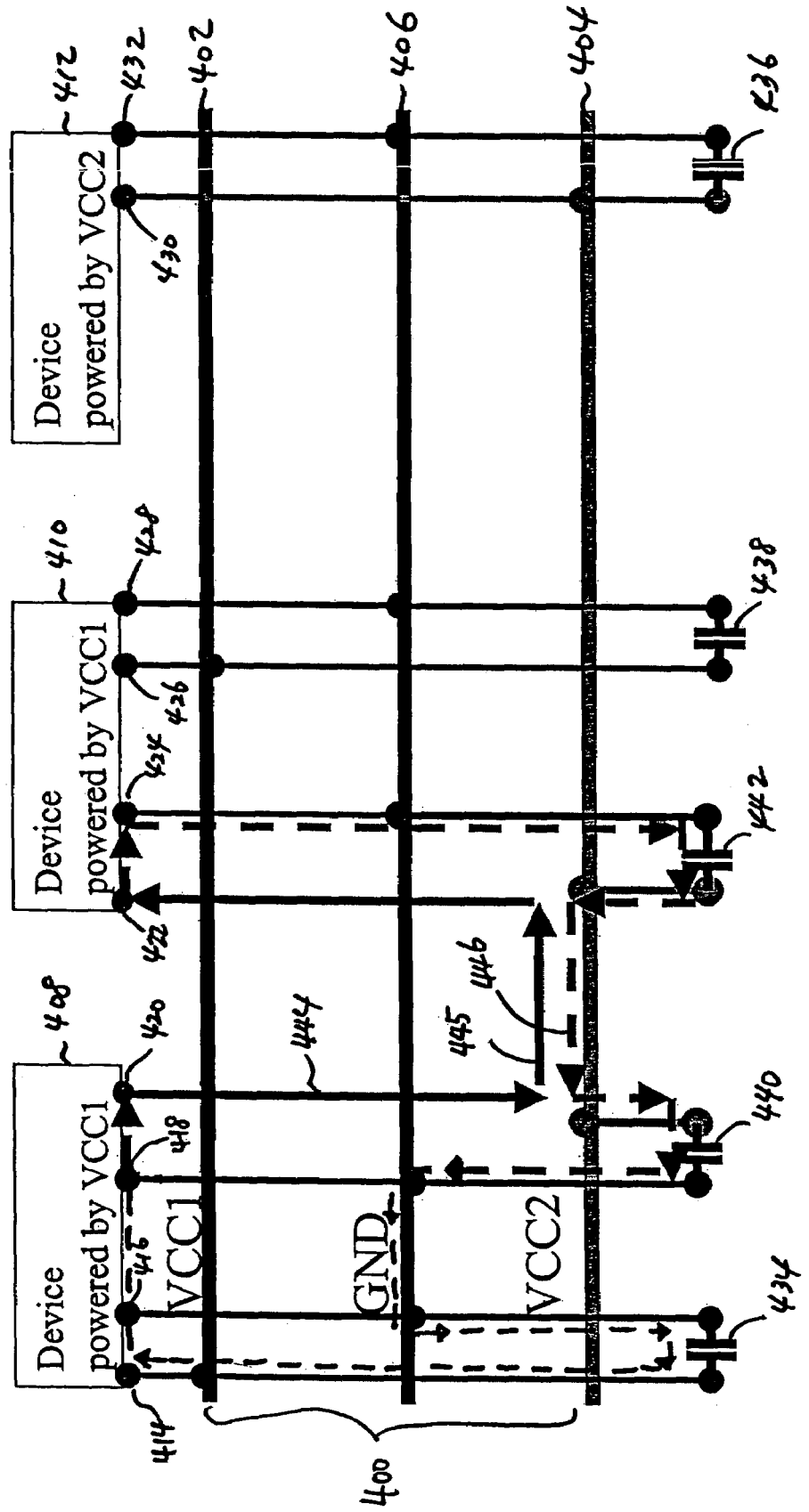
FIG. 4 is a diagram illustrating a multi-layer printed circuit board according to a first embodiment of the present invention.

FIG. 4 is a diagram illustrating a multi-layer printed circuit board 400 in accordance with a first embodiment of the present invention. The printed circuit board 400 shown in FIG. 4 is different from the conventional printed circuit board 200 shown in FIG. 2 in that additional bypass capacitors 440 and 442 were added. The printed circuit board 400 includes four layers, a Vcc1 supply voltage plane 402, a Vcc2 supply voltage plane 404, a GND plane 406 with conventional local decoupling capacitors 434, 436, 438, and a routing layer in which the signal current 445 flows. Two active devices, device 408 (driver part), device 410 (receiver part), and another active device 412 (unrelated to devices 408 and 410) are shown placed on the printed circuit board 400. The devices 408, 410, 412 may be any type of device such as an active integrated circuit (IC) chip or a discrete component. Device 408 has at least four pins 414, 416, 418, 420, device 410 has at least four pins 422, 424, 426, 428, and device 412 has at least two pins 430, 432. Devices 408 and 410 are powered by the Vcc1 plane 402, while device 412 is powered by the Vcc2 plane 404. Device 408 is connected to the Vcc1 plane 402 via pin 414, to the GND plane 406 via pins 416 and 418, and to device 410 via pin 420. Device 410 is connected to the Vcc1 plane 402 via pin 426, to the GND plane 406 via pins 428 and 424, and to device 408 via pin 422. Device 412 is connected to the Vcc2 plane 404 via pin 430 and to the GND plane 406 via pin 432.

In the printed circuit board 400 of FIG. 4, a signal current (solid line) 444 flows on the signal path between pin 420 of device 408 to pin 422 of device 410 with the current propagating in the routing layer routed adjacent to part of the Vcc2 plane 404 for impedance control. Vcc2 plane 404 does not power the devices 408, 410. This type of signal routing is common practice that permits for improved routing efficiency in multi-layer printed circuit boards. Here, the Vcc2 plane 404 operates as an alternate reference plane (or impedance control plane) for the signal current (solid line) 444.

Capacitors 434, 436, 438 are conventional local decoupling capacitors connected between the voltage source planes and ground planes to which devices 408, 410, 412 are connected. Specifically, capacitor 434 is a local decoupling capacitor connected between pin 414 and pin 416. Capacitor 438 is a local decoupling capacitor connected between pin 426 and pin 428. Capacitor 436 is a local decoupling capacitor connected between pin 430 and pin 432.

In addition to the conventional local decoupling capacitors 434, 436, 438, the printed circuit board 400 further comprises bypass capacitors 440, 442. Bypass capacitor 440 is adjacent to the signal source pin 420 and is connected between the impedance control plane 404 and the GND plane 406 and further coupled to pin 418, to provide a local current path between the Vcc2 impedance control plane 404 and the GND plane 406 and to the device 408. Bypass capacitor 442 is adjacent to the signal termination pin 422 and is connected between the impedance control plane 404 and the GND plane 406 and further coupled to pin 424, to provide a local current path between the Vcc2 impedance control plane 404 and the GND plane 406 and to the device 410.

As shown in FIG. 4, the current signal 444 between pins 420 and 422 is routed in a routing layer adjacent to a reference plane 404, which is separate from the GND plane 406 and does not power the devices 408 and 410. The devices 408 and 410 are not coupled to the Vcc2 reference plane (impedance control plane) 404. Nonetheless, the return current (dotted line) 446 required according to Kirchoff's first law can flow back directly from device 410 to device 408 via pins 424, 414, because the bypass capacitors 442, 440 provide a local return current path near the devices 408 and 410 for transitioning between the reference plane 404 and the GND plane 406. Because of the placement of the bypass capacitors 442, 440, the return current does not have to divert to an arbitrary local decoupling capacitor 436 far away from the devices 408, 410 for transitioning between reference planes. Thus, the return current 446 follows a short path closer in length to the signal current 444 path, resulting in a smaller and controlled return current path that leads to (i) a smaller loop area created by the signal current and its return current, and (ii) a smaller difference in path length between the signal current 444, 445 and its return current path 446 (improved balance). The reduced length and the better balance of the length of the signal path improve the signal performance on the signal path.

Once the locations to add the bypass capacitors 442, 440 have been determined as shown in FIG. 4, the value of the capacitances of the bypass capacitors 442, 440 can be readily determined by one skilled in the art based upon analysis of factors such as frequency, rise time, duty cycle, amplitude, waveform, etc. of the signal currents on the signal path 444 in order to enhance the signal integrity. These capacitance values will vary depending upon these factors, and one skilled in the art would make sure that such capacitance values are selected so as to provide a pass band sufficient for the frequency range of interest of the signals on the signal path 444. Furthermore, one skilled in the art would recognize how near the source pin 420 and how near the termination pin 422 the bypass capacitors 442, 440 should be located, respectively, in order to enhance the signal integrity.

Figure 3:
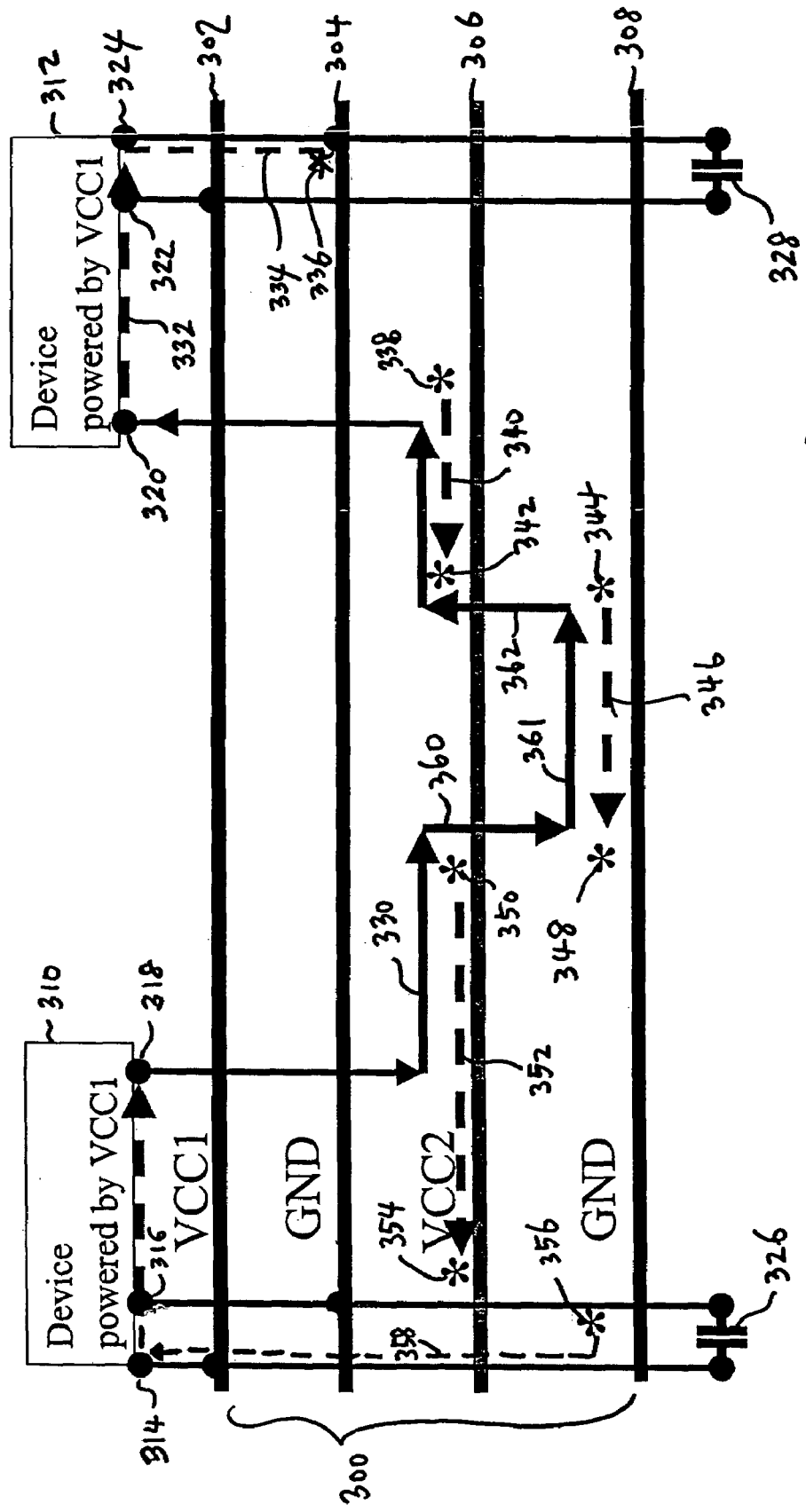
FIG. 3 is a diagram illustrating a third conventional multi-layer printed circuit board with conventional local decoupling capacitors.
Figure 5:
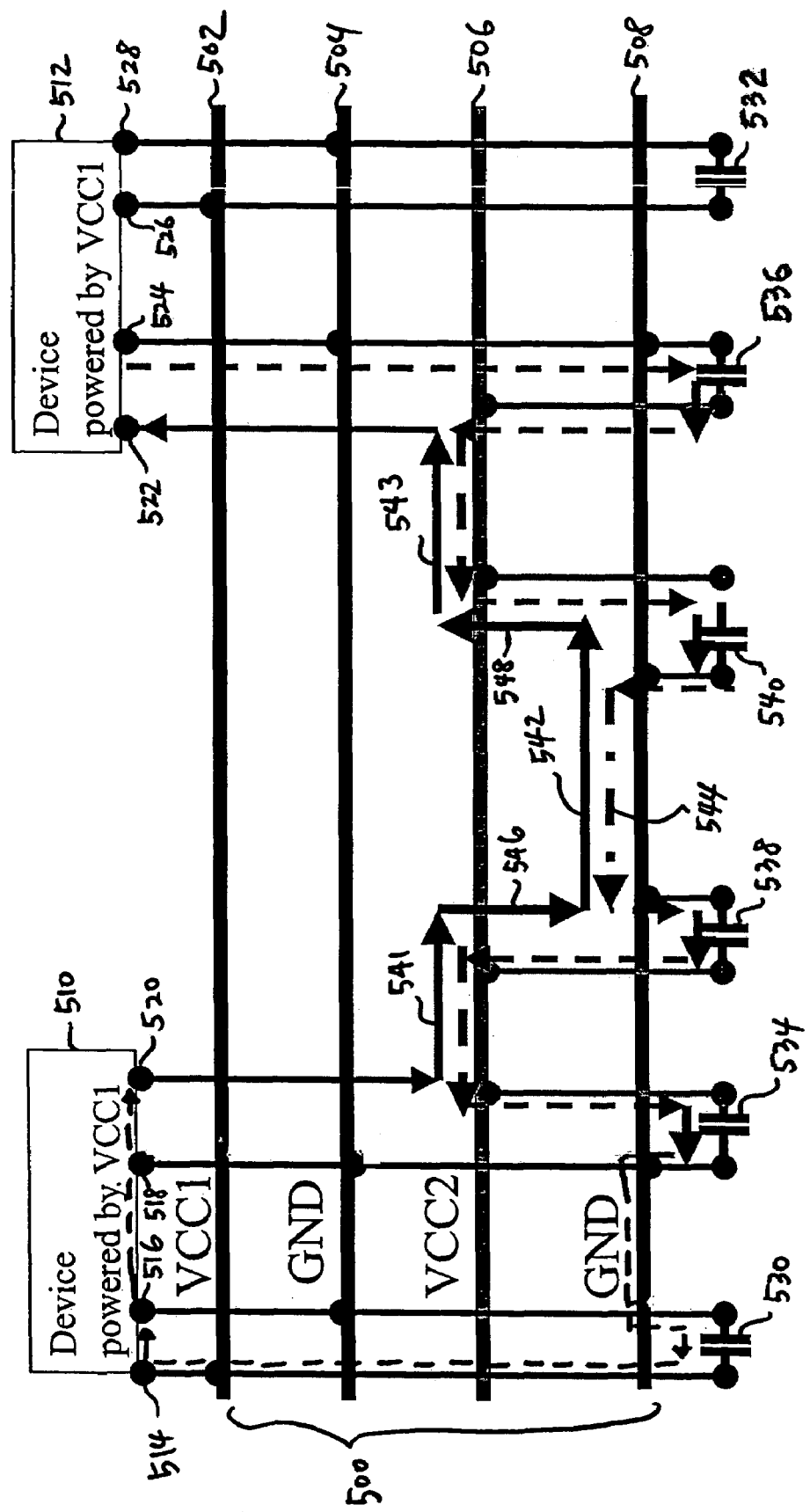
FIG. 5 is a diagram illustrating a multi-layer printed circuit board according to a second embodiment of the present invention.

FIG. 5 is a diagram illustrating a multi-layer printed circuit board 500 according to a second embodiment of the present invention. The printed circuit board 500 of the present invention shown in FIG. 5 is different from the conventional printed circuit board 300 shown in FIG. 3 in that additional bypass capacitors 534, 536, 538, 540 according to the present invention were added. The printed circuit board 500 includes six layers, a Vcc1 supply voltage plane 502, a Vcc2 supply voltage plane 506, and a first GND plane 504, a second GND plane 508 with conventional local decoupling capacitors 530, 532, and two routing layers in which the signal currents 541, 542, 543 flows. Two active devices, device 510 (driver part) and device 512 (receiver part) are placed on the printed circuit board 500. The devices 510, 512 may be any type of device such as an integrated circuit (IC) chip or a discrete component. Device 510 has at least four pins 514, 516, 518, 520, and device 512 has at least four pins 522, 524, 526, 528. Devices 510 and 512 are powered by the Vcc1 plane 502. Device 510 is connected to the Vcc1 plane 502 via pin 514, to the GND plane 504 via pins 516 and 518, and to device 512 via pin 520. Device 512 is connected to the Vcc1 plane 502 via pin 526, to the GND plane 504 via pins 524 and 528, and to device 510 via pin 522.

In the printed circuit board 500 of FIG. 5, a signal current (solid line) 542 flows on the signal path between pin 520 of device 510 to pin 522 of device 512 with the current routed on parts of both the Vcc2 plane 506 and the second GND plane 508 for impedance control. The Vcc2 plane 506 and the second GND plane 508 do not power the devices 510, 512. Thus, the signal current 541, 542, 543 is routed in routing layers adjacent to reference planes (impedance control planes) not powering the devices 510, 512 and is also routed adjacent to two reference planes (impedance control planes) 506, 508. The signal current 541, 542, 543 transitions between reference planes or impedance control planes by way of "routing vias" 546, 548. This use of routing vias affords improved routing efficiency in multi-layer printed circuit boards.

Capacitors 530, 532 are conventional local decoupling capacitors connected between the voltage source planes and ground planes to which devices 510, 512 are connected. Specifically, capacitor 530 is a conventional local decoupling capacitor connected between pin 514 and pin 516. Capacitor 532 is a conventional local decoupling capacitor connected between pin 526 and pin 528.

In addition to the conventional local decoupling capacitors 530, 532, the printed circuit board 500 further includes bypass capacitors 534, 536, 538, 540. Bypass capacitors 534, 536 are similar to the bypass capacitors 440, 442 shown in FIG. 4. Specifically, bypass capacitor 534 is adjacent to the signal source pin 520 and is connected between the Vcc2 impedance control plane 506 and the GND plane 508 and further coupled to the GND plane 504 and pin 518, to provide a local current path between the Vcc2 impedance control plane 508 and the other GND impedance control plane 508 and to the device 510. Bypass capacitor 536 is adjacent to the signal termination pin 522 and is connected between the Vcc2 impedance control plane 506 and the GND plane 508 and further coupled to the GND plane 504 and pin 524, to provide a local current path between the Vcc2 impedance control plane 506 and the GND impedance control plane 508 and to the device 512.

Bypass capacitors 538, 540 are coupled to the printed circuit board 500 in addition to the bypass capacitors 534, 536. Bypass capacitor 538 is connected near the routing via 546 and between the Vcc2 impedance control plane 506 and the GND plane 508, to provide a local current path between the Vcc2 impedance control plane 506 and the GND impedance control plane 508. Bypass capacitor 540 is connected near the routing via 548 and between the Vcc2 impedance control plane 506 and the GND impedance control plane 508, to provide a local current path between the Vcc2 impedance control plane 506 and the GND impedance control plane 506.

As shown in FIG. 5, the signal current (solid line) 541, 542, 543 between pins 520 and 522 is routed in routing layers adjacent to parts of reference planes 506 and 508 that do not power the devices 510 and 512. The devices 510 and 12 are not coupled to the Vcc2 reference plane (impedance control plane) 506. The signal current 541, 542, 543 transitions through routing vias 546, 548. Nonetheless, the return current (dotted line) 544 required according to Kirchoff's first law can flow back directly from device 512 to device 510 via pins 524, 514, because the bypass capacitors 536, 534 provide a local return current path near the devices 512 and 510 for transitioning between the reference plane 506 and the GND plane 508 and the bypass capacitors 538, 540 provide a local return current path near the routing vias 546, 548 for transitioning between the reference plane 506 and the GND plane 508. By providing the bypass capacitors 536, 534, 538, 540, the return current does not have to divert to an arbitrary local decoupling capacitor (not shown) far away from the devices 510, 512 for transitioning between reference planes. Thus, the return current 544 follows a short path closer in length to the signal current 541, 542, 543 path, resulting in a smaller and controlled return current path that leads to (i) a smaller loop area created by the signal current and its return current, and (ii) a smaller difference in path length between the signal current path and its return current path (improved balance). The reduced length and the better balance of the length of the signal path improve the signal performance on the signal path.

Once the locations to add the bypass capacitors 534, 538, 540, 536 have been determined according to the present invention as shown in FIG. 5, the value of the capacitances of the bypass capacitors 534, 538, 540, 536 can be readily determined by one skilled in the art based upon analysis of factors such as frequency, rise time, duty cycle, amplitude, waveform, etc. of the signal currents on the signal paths in order to improve the signal integrity. These capacitance values will vary depending upon these factors, and one skilled in the art would make sure that such capacitance values are selected so as to provide a pass band sufficient for the frequency range of interest of the signals on the signal paths. Furthermore, one skilled in the art would recognize how near the routing vias 536, 548 the bypass capacitors 536, 538 should be located, respectively, in order to improve the signal integrity.

Figure 6:
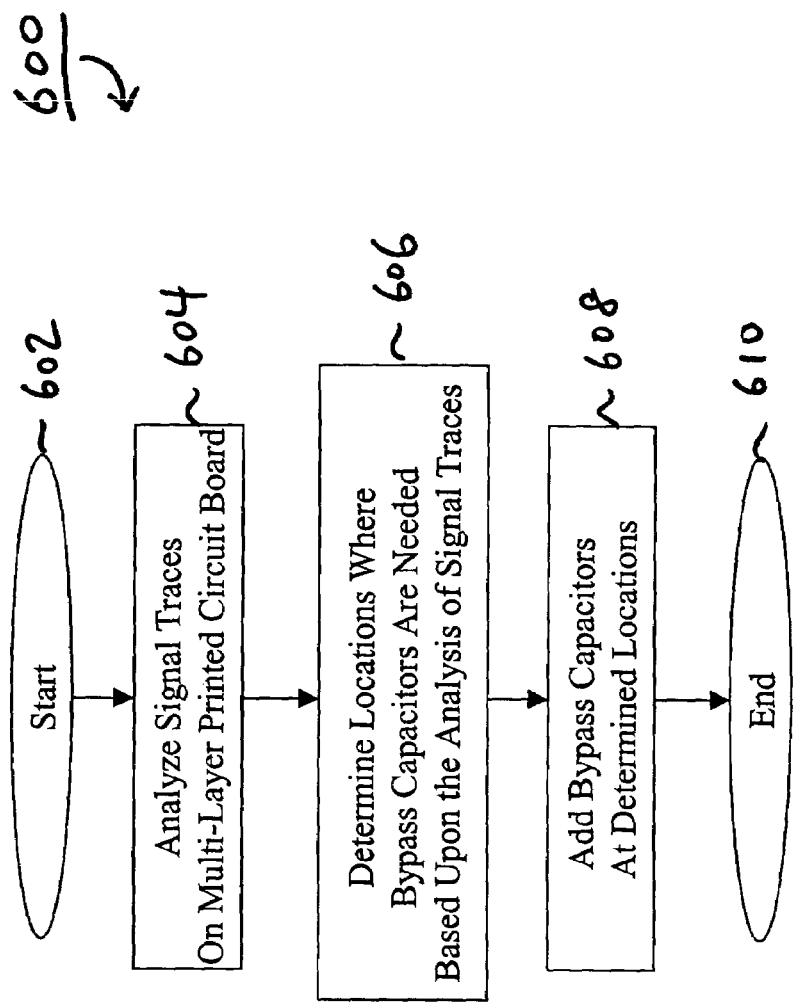
FIG. 6 is a flow chart illustrating a method of adding bypass capacitors to a multi-layer printed circuit board based upon analysis of signal traces according to one embodiment of the present invention.

FIG. 6 is a flow chart illustrating a method 600 of adding bypass capacitors to a multi-layer printed circuit board based upon analysis of signal traces according to one embodiment of the present invention. The method 600 of the present invention can be used with any type of multi-layer printed circuit board and with any configurations of signal traces thereon.

As the process is started 602, the signal traces on the multi-layer printed circuit board are analyzed 604. Such analysis includes inspecting each signal trace on the multi-layer printed circuit board for its end to end routing and gathering signal routing information regarding (i) the planes adjacent to which the signal trace is routed for impedance control, (ii) routing vias (signal layer transitions in the end to end route in series with the signal trace that introduces impedance control plane transitions), and (iii) source/destination termination points (direct connections from the signal trace to the supply voltage/GND and/or internal part characteristics that provide signal line termination to supply voltage/GND).

Once the signal traces have been analyzed 604, the locations where the bypass capacitors according to the present invention are needed are determined 606 based upon the analysis of the signal traces. Step 604 will be explained in more detail below with reference to FIG. 7. Then, the bypass capacitors are added 608 at the determined locations and the process ends 610.

Once the locations to add the bypass capacitors have been determined in step 606, the value of the capacitances of the bypass capacitors can be readily determined by one skilled in the art based upon analysis of factors such as frequency, rise time, duty cycle, amplitude, waveform, etc. of the signal currents on the signal paths in order to enhance the signal integrity. These capacitance values will vary depending upon these factors, and one skilled in the art would make sure that such capacitance values are selected so as to provide a pass band sufficient for the frequency range of interest of the signals on the signal paths.

Figure 7:
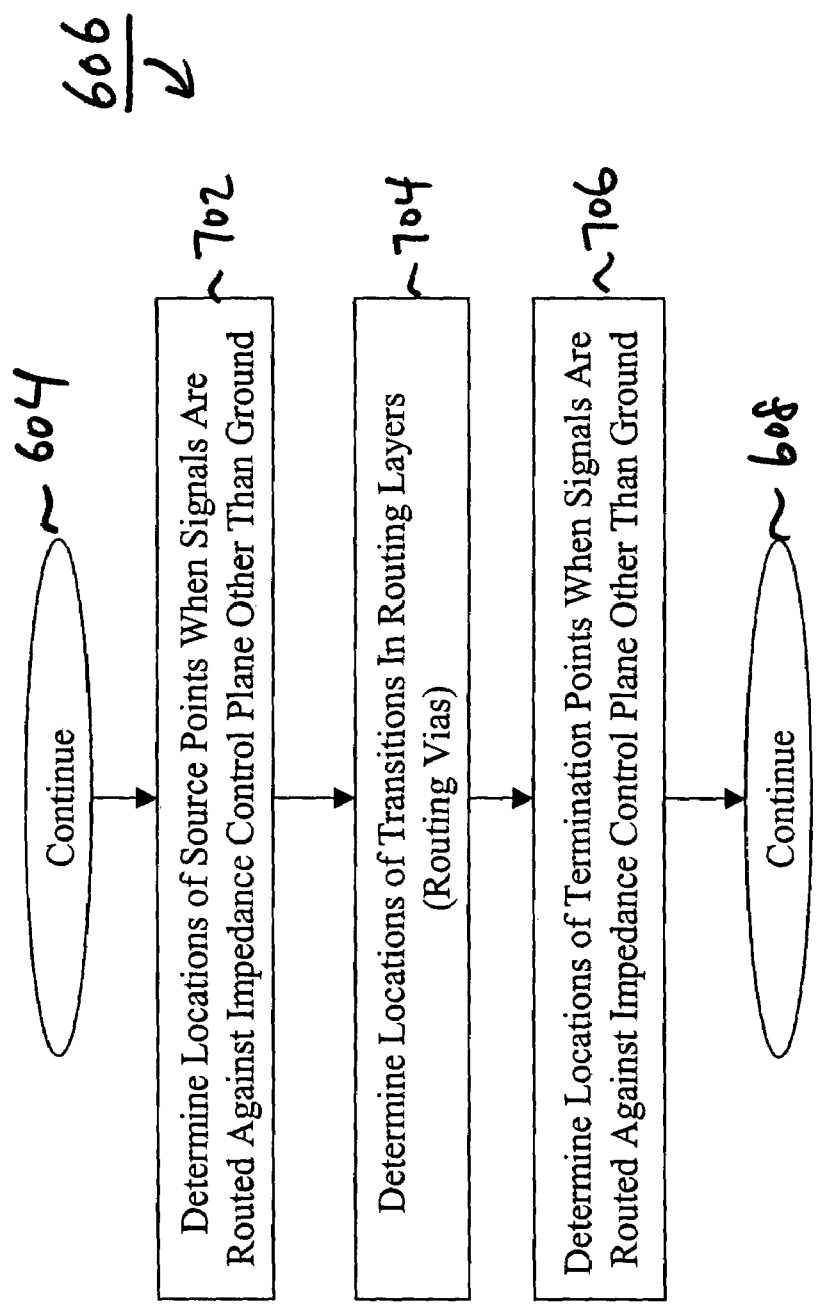
FIG. 7 is a flow chart illustrating a method of determining the locations to which the bypass capacitors should be added on the multi-layer printed circuit board based upon analysis of signal traces according to one embodiment of the present invention.

FIG. 7 is a flow chart illustrating a method 606 of determining the locations to which the bypass capacitors should be added on the multi-layer printed circuit boards based upon analysis of signal traces according to one embodiment of the present invention. The method 606 of FIG. 7 corresponds to step 606 of FIG. 6.

As the process continues 604, the method determines 702 the locations of source points where signals are routed in a routing layer adjacent to an impedance control plane other than GND. The bypass capacitor must be connected near the source point between the signal's impedance control plane (typically different from the supply voltage plane powering the parts) and GND. The bypass capacitor at this location provides connection from the GND to the impedance control plane during signal routing. One skilled in the art would recognize how near the source point the bypass capacitor should be located in order to improve signal integrity. The value of the bypass capacitor and the maximum distance from the source point of the part is selected based not upon analysis of the power/GND transients expected to be generated by the source device but upon the interconnecting signal characteristics (frequency and waveform) and required signal integrity. Bypass capacitor 440 of FIG. 4 and bypass capacitor 534 of FIG. 5 are examples of bypass capacitors added to the locations as determined in step 702.

The method determines 704 the locations of routing vias, i.e., transitions in signal routing layers that introduce return current transitions in two or more reference planes or impedance control planes. The bypass capacitors at these via locations are placed to interconnect the impedance control planes to GND near the signal via transition locations. One skilled in the art would recognize how near the signal routing vias the bypass capacitor should be located in order to improve signal integrity. As discussed above, the value of the bypass capacitor and the maximum distance from the vias is selected based upon the interconnecting signal characteristics (frequency and waveform) and required signal integrity. For multi-layer printed circuit boards with many routing vias, these bypass capacitors will be present in multiple locations. In one embodiment of the present invention, these bypass capacitors at the via locations are implemented as a "grid" of capacitors on the printed circuit board with the grid interval specified as a maximum dimension (e.g., 1 inch) or as a function of the signal velocity and wavelength to ensure the desired level of signal integrity and EMI (Electro-Magnetic Interference) performance. Bypass capacitors 538, 540 of FIG. 5 are examples of bypass capacitors added to the routing via locations as determined in step 704.

The method also determines 706 the locations of termination points where signals are routed in a routing layer adjacent to an impedance control plane other than GND. The bypass capacitor must be connected near the termination point between the signal's impedance control plane (typically different from the supply voltage plane powering the parts) and GND. The bypass capacitor at this location provides connection from the GND to the impedance control plane during signal routing. One skilled in the art would recognize how near the termination point the bypass capacitor should be located in order to improve signal integrity. The value of the bypass capacitor and the maximum distance from the termination point of the part is selected based not upon analysis of the power/GND transients expected to be generated by the receiver device but upon the interconnecting signal characteristics (frequency and waveform) and required signal integrity. Bypass capacitor 442 of FIG. 4 and bypass capacitor 536 of FIG. 5 are examples of bypass capacitors added to the locations as determined in step 706.

With the use of the bypass capacitors on multi-layer printed circuit boards according to the present invention, the total area of the current loop formed by the signal trace and its return current can be minimized. As such, signal integrity can be improved and noise can be controlled better as compared to printed circuit boards with only conventional decoupling capacitors.

Although the present invention has been described above with respect to several embodiments, various modifications can be made within the scope of the present invention. For example, the steps 702, 704, 706 of FIG. 7 may be performed independently of one another and in any other order. Only one of steps 702, 704, 706, or any two step combination of steps 702, 704, 706 in any order may be performed consistent with the present invention. The method of FIGS. 6–7 may be applied generally to any type of multi-layer printed circuit board with any devices installed thereon, for the purpose of improving signal integrity. Any type of capacitor may be used as the bypass capacitor according to the present invention, regardless of whether they are discrete component capacitors or parasitic capacitances associated with other devices on the printed circuit board. The present invention may be embodied in various forms, including computer program products, methods, and printed circuit boards, etc. Accordingly, the disclosure of the present invention is intended to be illustrative, but not limiting, of the scope of the invention, which is set forth in the following claims.

What is claimed is:

1. A method of determining locations for placing bypass capacitors for controlling the signal integrity of a signal routed from a first device to a second device via an interconnecting signal trace on a multi-layer printed circuit board, the printed circuit board including at least a first layer, a second layer, a third layer, and a fourth layer, the method comprising:

analyzing the routing of the interconnecting signal trace; and determining a location for a bypass capacitor based upon routing of the interconnecting signal trace in the third layer adjacent to the fourth layer, where the first layer powers the first and second devices, the second layer serves as a voltage reference plane for the first and second devices, the third layer serves as a routing layer for the interconnecting signal trace, and the fourth layer serves as an impedance control plane for the interconnecting signal trace but not powering nor serving as the voltage reference plane for the first and second devices, the location of the bypass capacitor decided in accordance with frequency and waveform characteristics of the interconnecting signal and required signal integrity.

2. The method of claim 1, wherein determining a location for a bypass capacitor comprises:

determining a location near a source point of the signal at the first device between the second layer and the fourth layer.

3. The method of claim 1, wherein determining a location for a bypass capacitor comprises:

determining a location near a termination point of the signal at the second device between the second layer and the fourth layer.

4. The method of claim 1, wherein determining a location for a bypass capacitor comprises:

determining a location near a source point of the signal at the first device between the second layer and the fourth layer; and determining a location near a termination point of the signal at the second device between the second layer and the fourth layer.

5. The method of claim 1, wherein the printed circuit board further includes a fifth layer and a sixth layer, the fifth layer also serving as a routing layer for the interconnecting signal trace, and the sixth layer also serving as an impedance control plane for the interconnecting signal trace, and determining a location for a bypass capacitor comprises:

determining a location near a routing via of the signal between the fourth layer and the sixth layer.

6. The method of claim 1, wherein the printed circuit board further includes a fifth layer and a sixth layer, the fifth layer also serving as a routing layer for the interconnecting signal trace, and the sixth layer also serving as an impedance control plane for the interconnecting signal trace and determining a location for a bypass capacitor comprises:

determining a location near a source point of the signal at the first device between the second layer and the fourth layer;

determining a location near a termination point of the signal at the second device between the second layer and the fourth layer; and determining a location near a routing via of the signal between the fourth layer and the sixth layer.

7. The method of claim 6, wherein:

the first layer is coupled to a first supply voltage;
the second layer is coupled to a first ground voltage;
the fourth layer is coupled to a second supply voltage; and
the sixth layer is coupled to a second ground voltage.

8. The method of claim 1, wherein the fourth layer powers a third device.

9. A printed circuit board with a first device and a second device mounted on the printed circuit board for routing a signal from the first device to the second device via an interconnecting signal trace, the multi-layer printed circuit board comprising:

a first layer coupled to and powering the first device and second device;

a second layer coupled to and serving as a voltage reference plane for the first device and second device;

a third layer serving as a routing layer for the interconnecting signal trace;

a fourth layer serving as an impedance control plane for the interconnecting signal trace but not powering nor serving as a voltage reference plane for the first device and the second device; and at least a bypass capacitor coupled between the second and the fourth layer.

10. The printed circuit board of claim 9, wherein the bypass capacitor comprises:

a bypass capacitor coupled near a source point of the signal at the first device between the second layer and the fourth layer.

11. The printed circuit board of claim 9, wherein the bypass capacitor comprises:

a bypass capacitor coupled near a termination point of the signal at the second device between the second layer and the fourth layer.

12. The printed circuit board of claim 9, wherein the bypass capacitor comprises:

a first bypass capacitor coupled near a source point of the signal at the first device between the second layer and the fourth layer; and a second bypass capacitor coupled near a termination point of the signal at the second device between the second layer and the fourth layer.

13. The printed circuit board of claim 9, wherein the printed circuit board further includes a fifth layer and a sixth layer, the fifth layer also serving as a routing layer for the interconnecting signal trace, and the sixth layer also serving as an impedance control plane for the interconnecting signal trace, and the printed circuit board further comprises:

a bypass capacitor coupled near a routing via between the fourth layer and the sixth layer.

14. The printed circuit board of claim 9, wherein the printed circuit board further includes a fifth layer and a sixth layer, the fifth layer also serving as a routing layer for the interconnecting signal trace, and the sixth layer also serving as an impedance control plane for the interconnecting signal trace, and the bypass capacitor comprises:

a first bypass capacitor coupled near a source point of the signal at the first device between the second layer and the fourth layer;

a second bypass capacitor coupled near a termination point of the signal at the second device between the second layer and the fourth layer; and the printed circuit board further comprises a third bypass capacitor coupled near a signal routing via between the fourth layer and the sixth layer.

15. The printed circuit board of claim 14, wherein:
the first layer is coupled to a first supply voltage;
the second layer is coupled to a first ground voltage;
the fourth layer is coupled to a second supply voltage; and
the sixth layer is coupled to a second ground voltage.

16. A computer program product stored on a computer readable medium and adapted to perform a method of determining locations for placing bypass capacitors for controlling the signal integrity of a signal routed from a first device to a second device via an interconnecting signal trace on a multi-layer printed circuit board, the printed circuit board including at least a first layer, a second layer, a third layer, and a fourth layer, the first layer powering the first and second devices, the second layer serving as a voltage reference plane for the first and second devices, the third layer serving as a routing layer for the interconnecting signal trace, and the fourth layer serving as an impedance control plane for the interconnecting signal trace but not powering nor serving as the voltage reference plane for the first and second devices, the method comprising:
analyzing the routing of the interconnecting signal trace; and
determining a location for a bypass capacitor based upon routing of the interconnecting signal trace in the third layer adjacent to the fourth layer.

17. The computer program product of claim 16, wherein determining a location for a bypass capacitor comprises:
determining a location near a source point of the signal at the first device between the second layer and the fourth layer.

18. The computer program product of claim 16, wherein determining a location for a bypass capacitor comprises:
determining a location near a termination point of the signal at the second device between the second layer and the fourth layer.

19. The computer program product of claim 16, wherein determining a location for a bypass capacitor comprises:
determining a location near a source point of the signal at the first device between the second layer and the fourth layer; and
determining a location near a termination point of the signal at the second device between the second layer and the fourth layer.

20. The computer program product of claim 16, wherein the printed circuit board further includes a fifth layer and a sixth layer, the fifth layer also serving as a routing layer for the interconnecting signal trace, and the sixth layer also serving as an impedance control plane for the interconnecting signal trace, and determining a location for a bypass capacitor comprises:
determining a location near a routing via of the signal between the fourth layer and the sixth layer.

21. The computer program product of claim 16, wherein the printed circuit board further includes a fifth layer and a sixth layer, the fifth layer also serving as a routing layer for the interconnecting signal trace, and the sixth layer also serving as an impedance control plane for the interconnecting signal trace and determining a location for a bypass capacitor comprises:
determining a location near a source point of the signal at the first device between the second layer and the fourth layer;
determining a location near a termination point of the signal at the second device between the second layer and the fourth layer; and
determining a location near a routing via of the signal between the fourth layer and the sixth layer.

* * * * *